United States Patent
Schunemann et al.

(10) Patent No.: US 12,203,191 B2
(45) Date of Patent: Jan. 21, 2025

(54) METHOD OF PRODUCING LARGE GaAs AND GaP INFRARED WINDOWS

(71) Applicant: BAE SYSTEMS Information and Electronic Systems Integration Inc., Nashua, NH (US)

(72) Inventors: Peter G. Schunemann, Hollis, NH (US); Kevin T. Zawilski, Arlington, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 242 days.

(21) Appl. No.: 18/073,228

(22) Filed: Dec. 1, 2022

(65) Prior Publication Data

US 2024/0183065 A1 Jun. 6, 2024

(51) Int. Cl.
| | | |
|---|---|---|
| C30B 33/06 | (2006.01) | |
| C30B 25/18 | (2006.01) | |
| C30B 29/42 | (2006.01) | |
| C30B 29/44 | (2006.01) | |
| C30B 31/06 | (2006.01) | |

(52) U.S. Cl.
CPC ............ *C30B 25/186* (2013.01); *C30B 29/42* (2013.01); *C30B 29/44* (2013.01); *C30B 31/06* (2013.01); *C30B 33/06* (2013.01)

(58) Field of Classification Search
CPC ......... C30B 31/06; C30B 33/06; C30B 29/44; C30B 29/42; C30B 25/186
See application file for complete search history.

(56) References Cited

U.S. PATENT DOCUMENTS

| | | | |
|---|---|---|---|
| 4,778,731 | A | 10/1988 | Kraatz |
| 4,939,043 | A | 7/1990 | Biricik |
| 5,173,443 | A | 12/1992 | Biricik |
| 5,824,418 | A | 10/1998 | Tully |
| 10,156,023 | B2 | 12/2018 | Schunemann |

(Continued)

OTHER PUBLICATIONS

Jeremy B. Reeves et al., Method of Optimizing the EMI Shielding and Infrared Transparency of GaAs IR Windows, patent application, filed Dec. 1, 2022, U.S. Appl. No. 18/072,931.

(Continued)

*Primary Examiner* — Robert M Kunemund
(74) *Attorney, Agent, or Firm* — Maine Cernota & Curran

(57) ABSTRACT

A method of growing large GaAs or GaP IR window slabs by HVPE, and in embodiments by LP-HVPE, includes obtaining a plurality of thin, single crystal, epitaxial-quality GaAs or GaP wafers, cleaving the wafers into tiles having ultra-flat, atomically smooth, substantially perpendicular edges, and then butting the tiles together to form an HVPE substrate larger than 4 inches for GaP, and larger than 8 inches or even 12 inches for GaAs. Subsequent HVPE growth causes the individual tiles to fuse by optical bonding into a large "tiled" single crystal wafer, while any defects nucleated at the tile boundaries are healed, causing the tiles to merge with themselves and with the slab with no physical boundaries, and no degradation in optical quality. A dopant such as Si can be added to the epitaxial gases during the final HVPE growth stage to produce EMI shielded GaAs windows.

26 Claims, 8 Drawing Sheets

(56) References Cited

U.S. PATENT DOCUMENTS

| | | | |
|---|---|---|---|
| 2010/0219509 A1* | 9/2010 | He | H01L 31/0735 257/E29.089 |
| 2011/0256693 A1* | 10/2011 | D'Evelyn | H01L 29/34 117/73 |
| 2012/0031324 A1* | 2/2012 | Hiromura | H01L 21/02658 117/94 |
| 2014/0162441 A1* | 6/2014 | Preble | H01L 33/30 438/488 |
| 2017/0362739 A1* | 12/2017 | Kajimoto | C30B 25/20 |

OTHER PUBLICATIONS

Peter G. Schunemann et al., Method of Producing Large GaAs and GaP Infrared Windows, patent application, filed Dec. 1, 2022, U.S. Appl. No. 18/073,177.

Peter G. Schunemann et al., Method of Producing Large EMI Shielded GaAs Infrared Windows, patent application, filed Dec. 1, 2022, U.S. Appl. No. 18/073,179.

Peter G. Schunemann et al., Method of Producing Large EMI Shielded GaAs and GaP Infrared Windows, patent application, filed Dec. 1, 2022, U.S. Appl. No. 18/073,183.

Sotoodeh, M., A. H. Khalid, and A. A. Rezazadeh. "Empirical low-field mobility model for III-V compounds applicable in device simulation codes." Journal of applied physics 87.6 dated Mar. 15, 2000): 2890-2900.

Stromberg, A., Bhargava, P., Xu, Z., Lourdudoss, S. and Sun, Y. (2021), Direct Heteroepitaxy and Selective Area Growth of GaP and GaAs on Si by Hydride Vapor Phase Epitaxy. Phys. Status Solidi A, dated Oct. 17, 2020 218.3.

* cited by examiner

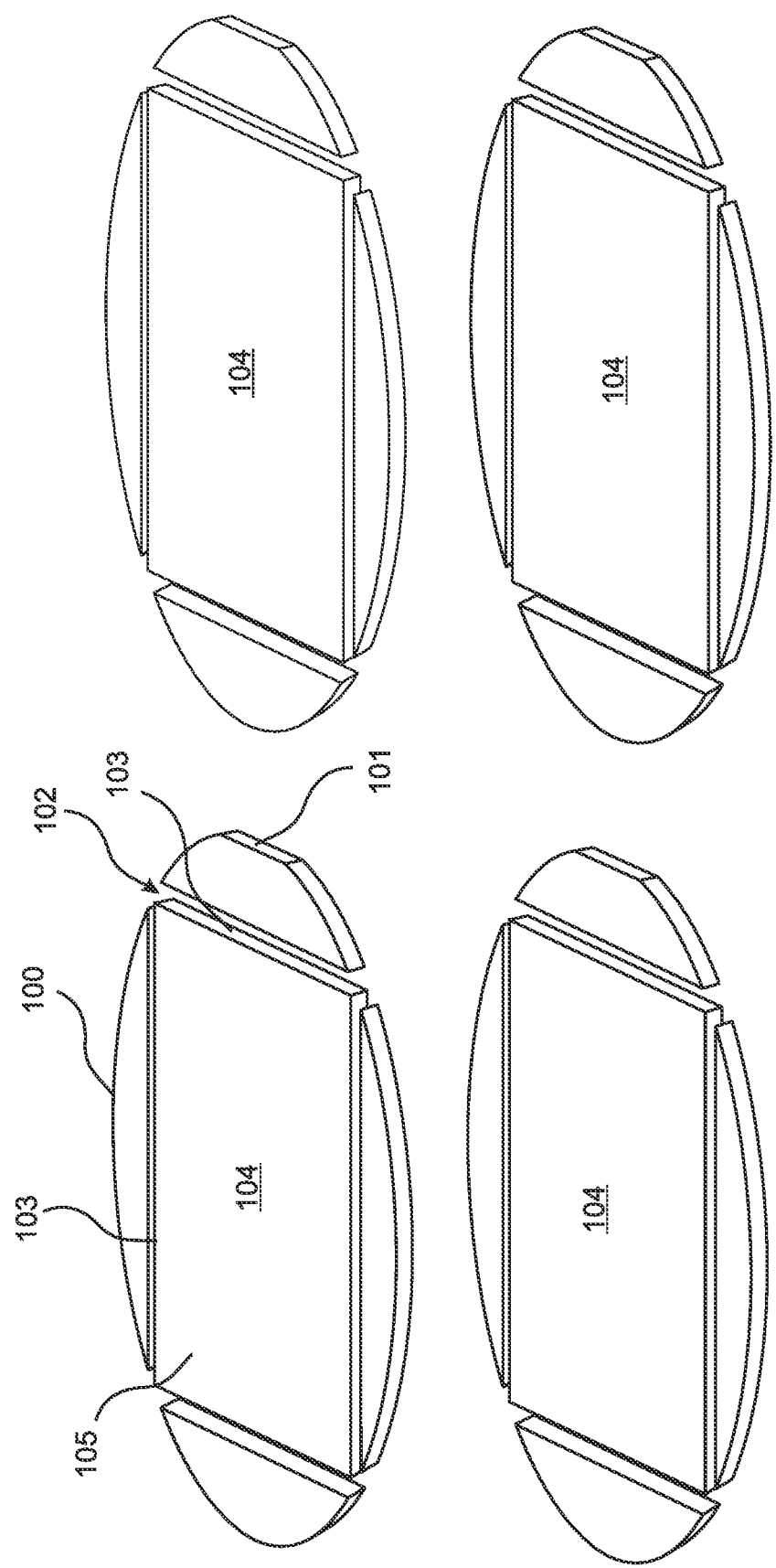

METHOD OF PRODUCING LARGE GaAs AND GaP INFRARED WINDOWS

RELATED APPLICATIONS

This application is related to co-pending U.S. application Ser. Nos. 18/072,931, 18/073,177, 18/073,179, and 18/073,183, all of which were filed on Dec. 1, 2022, all of which are herein incorporated by reference in their entirety for all purposes.

FIELD

The disclosure relates to optical windows, and more particularly, to GaAs infrared optical windows that are more than eight inches in diameter and and GaP infrared optical windows that are more than four inches in diameter.

BACKGROUND

A growing number of optical systems incorporate infrared (IR) sensors and/or lasers that operate over a wide range of wavelengths between one and twelve microns. Accordingly, the platforms on which these devices are mounted require optical windows that are transparent over this broad spectral range. A growing number of these applications require windows having a largest diameter of more than 4 inches more than 8 inches, and in some cases more than 12 inches, which in turn requires that the window material must be relatively hard, so that the window will be structurally competent without being unduly thick.

Furthermore, as electronics and sensor systems become more highly and densely integrated, the need has increased for electromagnetic shielding (EMI) of components. For systems that require optical windows, it has therefore become increasingly necessary to provide EMI shielded windows, i.e. windows that have very low absorption at wavelengths of interest, while also shielding the window aperture against electromagnetic penetration.

The material that is most commonly used to manufacture such IR windows is hot-isostatic-pressed (HIP) polycrystalline Zinc Sulfide (ZnS), due to the broad spectral transparency of ZnS, and also because the HIP process is relatively quick, and the window size when using this polycrystalline material is limited only by the size of the high-pressure containment vessel in which the HIP is applied. However, the mechanical properties of HIP ZnS are only adequate at best, which can sometimes limit application of the material to large IR windows, such as IR windows greater than 12 inches in diameter. Furthermore, HIP ZnS is generally produced by first growing crystalline ZnS by CVD, and then applying the additional step of HIP, which adds to the cost of the final product.

When EMI shielding is required, HIP ZnS windows generally rely on a metallic grid coating deposited onto a window surface. However, the metal lines in the grid coating are opaque to IR radiation, obscuring portions of the window, and can significantly reduce the optical transmission of the window, especially at large angles of incidence. Additionally, the grid pattern can lead to diffraction of IR waves passing through the material, which can have substantial negative impacts on system performance.

In many cases, to provide EMI shielding, it would be preferable to deposit a thin conducting layer of a doped semiconductor onto a surface of an IR window, as an alternative to a metallic grid. Unfortunately, is nearly impossible to dope ZnS to produce a conductive EMI layer, due to its tendency to form compensating defects that neutralize dopants to maintain their insulating properties. This problem can be circumvented by preparing a separate, thin wafer of a doped semiconductor such as GaAs or GaP, and then attaching the wafer to the surface of an HIP ZnS window by optical bonding. However, this approach can be time consuming, difficult, and expensive.

As is discussed in more detail in co-pending U.S. application Ser. No. 18/072,931, filed on Dec. 1, 2022, which is also by the present Applicant and is incorporated herein by reference, IR windows made from gallium arsenide (GaAs) and gallium phosphate (GaP) are an attractive alternative to windows made from HIP ZnS.

GaAs is highly transparent from 1.7 to 12 microns, exhibits about 3.5× higher hardness compared to HIP ZnS, and can be easily and precisely doped to control the electrical properties of thin epitaxially applied conducting layers.

Gallium phosphide, GaP, is highly transparent between 0.7 and 8.5 microns, and does not absorb strongly until nearly 11 microns. It has an even higher mechanical strength than GaAs, and substantially higher visible and near-IR transparency than GaAs, at the expense of reduced transparency at longer wavelengths. Like GaAs, GaP can also be easily and precisely doped to control the electrical properties of thin, epitaxially applied conducting layers.

Relatively small, thin wafers of GaAs and GaP have been widely used in the integrated circuit (IC) and photovoltaic (i.e. solar cell) industries. GaAs and GaP substrate wafers are cut from single crystals grown by melt techniques, primarily Czochralski (Cz) or Vertical Gradient Freeze (VGF) growth. IC's, solar cells, and other multi-layer device structures are typically then grown on these substrates by epitaxial methods such as Molecular Beam Epitaxy (MBE) or Metal Organic Vapor Phase Epitaxy (MOVPE) with precisely controlled layer thicknesses. The total device structures are limited to thicknesses of several microns, and scaling to thicknesses beyond this is precluded by the very slow growth rates achievable by these epitaxial techniques.

The Cz and VGF techniques used to produce GaAs and GaP substrates for most IC and photovoltaic applications could also be used to produce IR windows by slicing much thicker slabs (several millimeters) from the single crystal boules grown from melt.

However, boules of GaAs that are grown from melt are generally limited to eight inches in diameter or less, while boules of GaP are generally limited to only 3 inches in diameter, and even these are not widely available. Furthermore, scaling the existing GaAs melt-growth techniques to larger diameters would be extremely challenging, for both GaAs and GaP, due to the difficulty of extracting more and more heat while controlling the interface shape and crystal quality during growth from ever increasing melt sizes. Managing the high equilibrium vapor pressure during growth, particularly for GaP, becomes problematic at larger boule diameters.

This inability to produce larger diameter boules has prevented the use of GaAs and GaP as slab materials for large EMI-shielded IR windows, e.g. for GaP windows having a largest dimension that is greater than 4 inches, and both GaAs and GaP windows having a largest dimension that is greater than 8 inches, and up to 12 inches and more. Furthermore, GaAs window slabs that are sliced from boules have significant IR absorption bands, especially near 1 micron, due to so-called "EL2" defects that arise from excess arsenic being incorporated into the crystal structure.

This has further limited the use of GaAs IR windows when transparency is desired near 1 micron, even for smaller windows.

As is discussed in more detail in co-pending U.S. application Ser. No. 18/073,177, filed on Dec. 1, 2022, which is also by the present Applicant and is incorporated herein by reference, single crystal GaP slabs having largest dimensions that are greater than 4 inches, and both GaAs and GaP slabs having largest dimensions that are greater than 8 inches, and in embodiments up to 12 inches and more, can be produced epitaxially by HVPE, and in embodiments by LP-HVPE. This approach overcomes the size limitations that apply to slabs cleaved from boules, and also, in the case of GaAs, substantially reduces the EL2 absorption bands, due to the ultra-high purity gases that can be used in HVPE.

Commercial, epitaxial-quality GaAs and GaP substrates are available, and can be used for HVPE production of GaAs and GaP slabs. However, these substrates are only available in small sizes, having largest dimensions that are considerably less than eight inches for GaAs, and less than 4 inches for GaP.

Silicon wafers can be used as substrates for HVPE growth of large-scale GaAs and GaP window slabs. Si wafers are inexpensive, are of extremely high crystalline quality (dislocation-free), and are commercially available in very large diameters (12" standard, 18" custom, and up to 24" has been demonstrated).

However, HVPE growth of GaAs or GaP on silicon substrates can be problematic. First, the successful nucleation of high-quality epitaxial GaAs or GaP on silicon is challenging, and requiring a precise and narrow window of process parameters with low yields. Also, the thermal expansion mismatch between the HVPE-grown GaAs or GaP layer and the silicon substrate can cause severe "bowing" of the slab during the post-growth cooling cycle. Finally, the requirement to grind off or otherwise remove the silicon substrate from the window slab adds additional cost and complexity to the manufacturing process.

In addition, while the lattice constant for GaP is nearly identical to the silicon lattice constant, the lattice constant for GaAs differs somewhat from silicon, which can lead to a high concentration of surface defects arising from dislocations. One approach is to apply thick and gradual buffer layers at the initial stages of the HVPE growth, for example by varying the composition of a GaAsP seed layer from 0% to 100% arsenic, thereby beginning with a layer of GaP applied to silicon, and then gradually transitioning from GaP to GaAs. However, this approach increases the growth time and reactor complexity that is required to grow the slab, and also increases the amount of seed material that must be ground and polished off of the slab after it is grown by HVPE.

What is needed, therefore, is a method of growing GaAs and GaP IR window slabs by HVPE that simplifies epitaxial nucleation, eliminates bowing of the slabs, avoids the application of substrate buffer layers, and preferably does not require grinding off the substrate after growth, where the resulting GaP slabs have largest dimensions greater than 4 inches, and GaAs slabs have largest dimensions greater than 8 inches, and preferably up to 12 inches or more, where the slabs are sufficiently thick to be structurally competent when used as IR windows.

SUMMARY

The present disclosure is a method of growing GaAs and GaP IR window slabs by HVPE without causing bowing of the slabs and without requiring the use of substrate buffer layers, where the resulting GaP slabs having largest dimensions greater than 4 inches, and GaAs slabs have largest dimensions greater than 8 inches, and preferably up to 12 inches or more, where the slabs are sufficiently thick to be structurally competent when used as IR windows. In embodiments, it is not necessary to grind the substrate off of the slab after it is grown. In some embodiments, low pressure HVPE (LP-HVPE) is used to make the slabs.

It will be understood that the present disclosure is not limited to round GaAs and GaP slabs, and that the term "diameter" as used herein should be interpreted to mean "largest dimension" unless otherwise required by context.

More specifically, the disclosed method includes producing a "tiled" single crystal GaP wafer having a largest diameter that is greater than four inches, or a GaAs wafer having a largest diameter that is greater than eight inches and in embodiments greater than 12 inches, and then using the tiled wafer as a substrate for growing a GaAs and GaP IR window slab by HVPE, including by LP-HVPE.

According to the disclosed method, a plurality of epitaxial-quality GaAs or GaP substrates, are cleaved into tiles, which in embodiments are square or rectangular tiles. In embodiments, the epitaxial-quality substrates are obtained commercially. When the substrates are sufficiently thin and carefully cleaved, the cleaving process yields ultra-flat, atomically smooth, and crystallographically defined edges that are substantially perpendicular. In embodiments, the cleaving is along (110) crystallographic planes. The square tiles are then butted together in intimate contact to form a single mosaic substrate, and subsequent HVPE growth on the adjacent tiles of this mosaic substrate results in a thick and continuous crystal of GaAs or GaP that overgrows and eliminates the original boundaries between the tiled substrates, yielding a GaP single crystal slab having a largest dimension that is greater than four inches, or a GaAs single crystal slab having a largest dimension that is greater than eight inches, and in embodiments greater than 12 inches. A single, long HVPE growth run, or several shorter sequential growth runs, produces a GaAs or GaP slab of sufficient thickness to exhibit the structural integrity required for IR window applications.

During the HVPE growth, any defects that might be nucleated at the tile boundaries are healed, causing the tiles to merge with no physical boundary between the individual tiles and no degradation in optical quality.

The final result is the production of a single crystal GaAs or GaP IR window slab having uniform optical properties and having a largest dimension that is greater than four inches for GaP, and greater than eight inches for GaAs, and in embodiments greater than 12 inches. The disclosed method thereby enables scaling of the substrate up to a size that is limited only by the reactor geometry, and eliminates the "bowing" and other problems and complexities of HVPE growth on a foreign substrate.

In some embodiments, some of the interfaces between the cleaved substrates may not completely fuse during the HVPE growth of the window slab, thereby requiring subsequent removal of the substrate. In other embodiments, the substrate remains as a permanent and indistinguishable component of the GaAs or GaP window slab, thereby obviating any requirement to grind the substrate away in a subsequent production step.

In some embodiments, EMI shielded GaAs and GaP windows are produced by adding a dopant such as Si to the epitaxial gases during the final stage of HVPE growth. In other embodiments, EMI shielded GaAs and GaP windows are produced by applying a layer of doped GaAs or GaP to the window in a subsequent deposition step, for example using an epitaxial method such as molecular beam epitaxy (MBE), metal-organic vapor phase epitaxy (MOVPE), metallo-organic chemical vapor deposition (MOCVD, or organo-metallic vapor phase epitaxy (OMVPE).

Embodiments further include applying an anti-reflective coating to the window slab, or to the doped conducting layer (if present).

A first general aspect of the present disclosure is a slab of GaAs having a largest dimension that is greater than eight inches or a slab of GaP having a largest dimension that is greater than four inches, the slab being suitable for forming an infrared (IR) transparent window. The slab is formed by the process:

obtaining a plurality of epitaxial quality GaAs or GaP wafers;

cleaving the wafers into tiles having cleaved edges;

aligning the cleaved edges of the tiles on a substrate holder in intimate contact, optical bonding thereof thereby yielding a tiled GaAs substrate having a largest dimension that is greater than eight inches or a GaP substrate having a largest dimension that is greater than four inches;

preparing an HVPE reactor having a reaction chamber that is sufficiently large to contain the tiled substrate and to apply gasses thereto;

placing the substrate holder and tiled substrate into the reaction chamber of the HVPE reactor;

applying a plurality of HVPE gases to a surface of the tiled substrate within the reaction chamber, such that at least two of the HVPE gases react with each other to form GaAs or GaP on the tiled substrate via HVPE, thereby causing a slab of GaAs to form on the tiled substrate having a largest dimension of greater than eight inches, or a slab of GaP having a largest dimension of greater than four inches; and growing the GaAs or GaP slab via the HVPE to a desired thickness by continuing to apply the gases to a surface of the slab.

In embodiments, any defects that are nucleated at the boundaries of the tiles are healed as the slab is grown via HVPE, causing the tiles to merge together with no physical boundaries between them and substantially no degradation in optical quality of the slab, thereby obviating any need to grind away the tiled substrate after the growing by HVPE has been completed.

In any of the above embodiments, cleaving the wafers can include cleaving the wafers along a (110) crystalline direction.

In any of the above embodiments, the slab can be a slab of GaAs having a largest dimension of greater than 12 inches, or a slab of GaP having a largest dimension of greater than 8 inches.

In any of the above embodiments, a thickness of the slab can be at least 2 mm.

Any of the above embodiments can include an electrically conductive layer of doped GaAs or GaP on the slab.

Any of the above embodiments can further include an anti-reflective coating applied to at least one surface of the slab.

A second general aspect of the present disclosure is a method of producing a slab of GaAs or GaP, the slab being suitable for forming a GaAs infrared (IR) transparent window having a largest dimension that is greater than eight inches, or a GaP infrared (IR) transparent window having a largest dimension that is greater than four inches. The method includes obtaining a plurality of epitaxial quality GaAs or GaP wafers, cleaving the wafers into tiles having cleaved edges, aligning the cleaved edges of the tiles on a substrate holder in intimate contact, optical bonding thereof thereby yielding a GaAs tiled substrate having a largest dimension that is greater than eight inches, or a GaP tiled substrate having a largest dimension that is greater than four inches, preparing an HVPE reactor having a reaction chamber that is sufficiently large to contain the tiled substrate and to apply gasses thereto, placing the substrate holder and tiled substrate into the reaction chamber of the HVPE reactor, applying a plurality of HVPE gases to a surface of the tiled substrate within the reaction chamber, such that at least two of the HVPE gases react with each other to form GaAs or GaP on the tiled substrate via HVPE, thereby causing a slab of GaAs to form on the tiled substrate having a largest dimension of greater than eight inches, or a slab of GaP having a largest dimension of greater than four inches, and growing the GaAs or GaP slab via the HVPE to a desired thickness by continuing to apply the gases to a surface of the slab.

In embodiments, the method further includes heating the tiled substrate while applying a preliminary gas thereto prior to causing the slab of GaAs or GaP to form on the tiled substrate, said preliminary gas being flowing arsine if the tiled substrate is a GaAs substrate, or flowing phosphine if the tiled substrate is a GaP substrate.

In any of the above embodiments, obtaining the epitaxial quality GaAs or GaP wafers can include obtaining the wafers from a commercial source.

In any of the above embodiments, any defects that are nucleated at the boundaries of the tiles can be healed as the slab is grown via HVPE, causing the tiles to merge together with no physical boundaries between them and substantially no degradation in optical quality of the slab, thereby obviating any need to grind away the tiled wafer after the growing by HVPE has been completed.

In any of the above embodiments, the HVPE can be LP-HVPE.

In any of the above embodiments, cleaving the slices can include cleaving the slices along a (110) crystalline direction of the GaAs or GaP wafers.

In any of the above embodiments, the tiles can be rectangular.

In any of the above embodiments, the tiles can be parallelograms.

In any of the above embodiments, the slab can be a slab of GaAs having a largest dimension of greater than 12 inches, or a slab of GaP having a largest dimension of greater than 8 inches.

In any of the above embodiments, the desired thickness can be at least 2 mm. In some of these embodiments a time required to grow the slab to the desired thickness is no greater than 1 week.

Any of the above embodiments can further include, during a final phase of growing the slab, including a dopant gas as one of the gases that are applied to the surface of the slab, thereby forming an electrically conductive layer of doped GaAs or GaP on the slab. In some of these embodiments the dopant gas contains silicon.

Any of the above embodiments can further include applying a layer of doped GaAs or GaP to a surface of the slab after the slab has been removed from the HVPE reactor.

In any of the above embodiments, one of the HVPE gases can be GaCl. In some of these embodiments, the GaCl is formed by reacting HCl gas with liquid Ga.

In any of the above embodiments, one of the HVPE gases can be AsH3.

In any of the above embodiments, one of the HVPE gases can be PH3.

And any of the above embodiments can include, after the slab has grown to the desired thickness, applying an anti-reflective coating to at least one surface of the slab.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIG. 1A is a perspective view of a plurality of round GaAs or GaP commercial epitaxial-quality substrate wafers, illustrating cleaving of said wafers into a plurality of rectangular tiles;

DETAILED DESCRIPTION

Figure 1B:
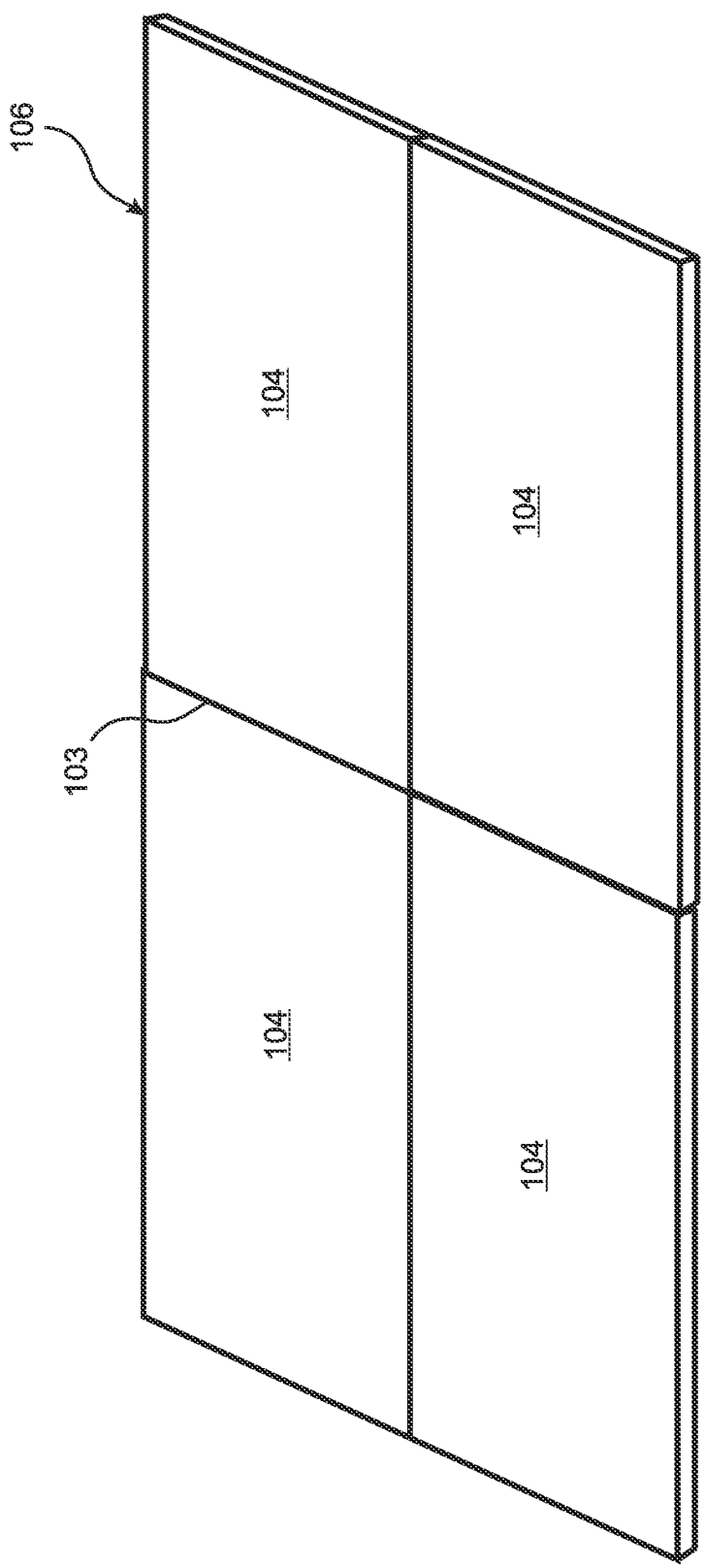
FIG. 1B is a perspective view showing the cleaved facets of the rectangular tiles contacted to form a single composite tiled substrate.

The present disclosure is a method of growing GaAs and GaP IR window slabs by HVPE without causing bowing of the slabs, without requiring the use of substrate buffer layers, where the resulting GaAs and GaP slabs have largest dimensions greater than 8 inches, and preferably up to 12 inches or more, and are sufficiently thick to be structurally competent when used as IR windows. In embodiments, it is not necessary to grind the substrate off of the slab after it is grown. In the preferred embodiment, low pressure HVPE (LP-HVPE) is used to make the slabs.

It will be understood that the present disclosure is primarily focused on rectangular GaAs or GaP slabs, but extends to slabs of any shape, and that the term "diameter" as used herein should be interpreted to mean "largest dimension" unless otherwise required by context.

More specifically, the disclosed method includes cleaving commercial epitaxial-quality wafers into rectangular substrates, contacting the cleaved faces in a tray to produce a "tiled" GaAs or GaP substrate, and then using HVPE, including LP-HVPE, to grow a thick GaAs or GaP IR window slab having a largest dimension that is greater than four inches for GaP, or greater than eight inches for GaAs, and in embodiments greater than 12 inches. In embodiments, the cleaved tile boundaries are fused and ultimately eliminated to yield a large aperture composite single crystal.

With reference to FIG. 1A, a plurality of commercial epitaxial-quality wafers 100 of GaAs or GaP are obtained, preferably in the largest commercially-available diameter (currently 6 or 8 inches for GaAs and 3 inches for GaP). Each of these wafers is then cleaved 102, preferably along directions parallel or perpendicular to the major wafer flat 101, to produce extremely smooth, flat, and substantially perpendicular edge facets 103 on the four edges of a now rectangular (or square) substrate tile 104. In embodiments, the orientations of the major flat 105 and the cleaved facets 103 are chosen on preferred low-index crystallographic faces that offer optimal cleaving behavior.

With reference to FIG. 1B, each of the cleaved tiles 104 is arranged with at least one of the cleaved faces 103 butted in intimate contact with at least one other (and in many cases two, three, four, or more) cleaved tiles 104.

Figure 1C:
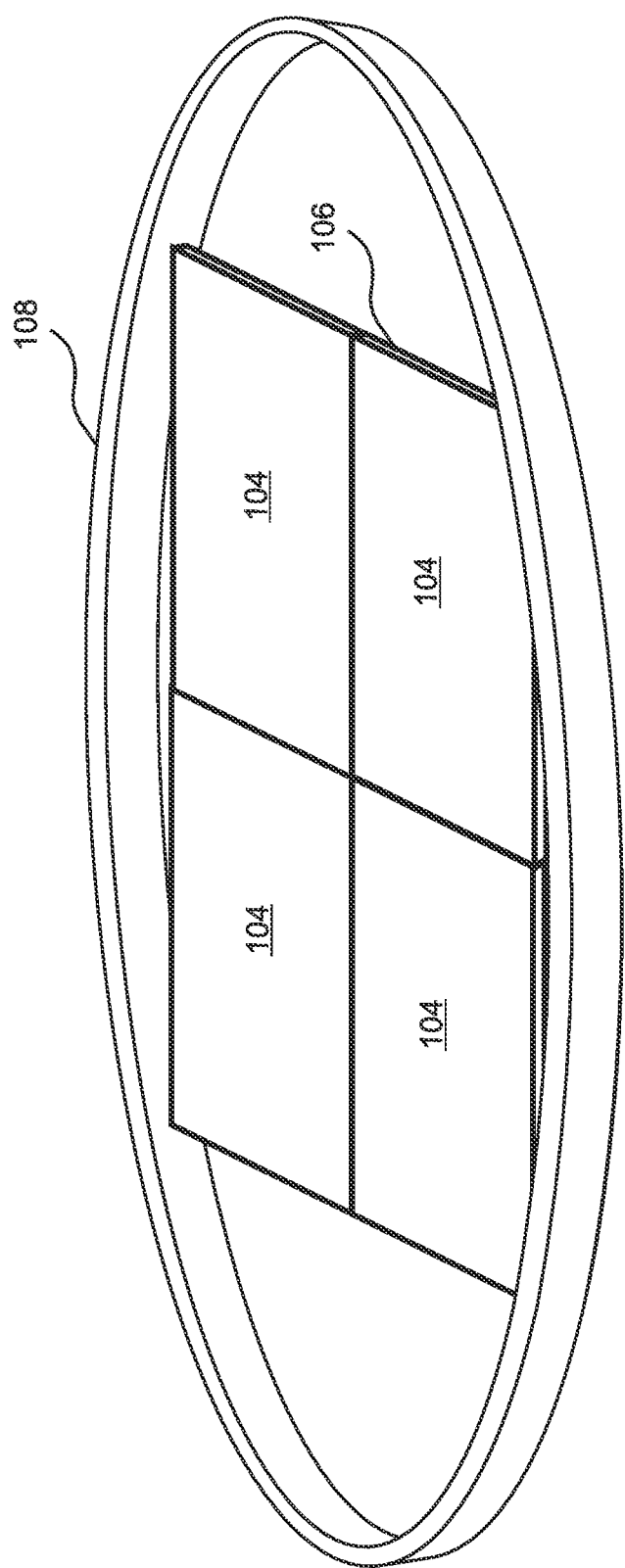
FIG. 1C shows the tiled substrate of FIG. 1B placed on a round substrate tray suitable for rotation during LP-HVPE crystal growth.
Figure 1D:
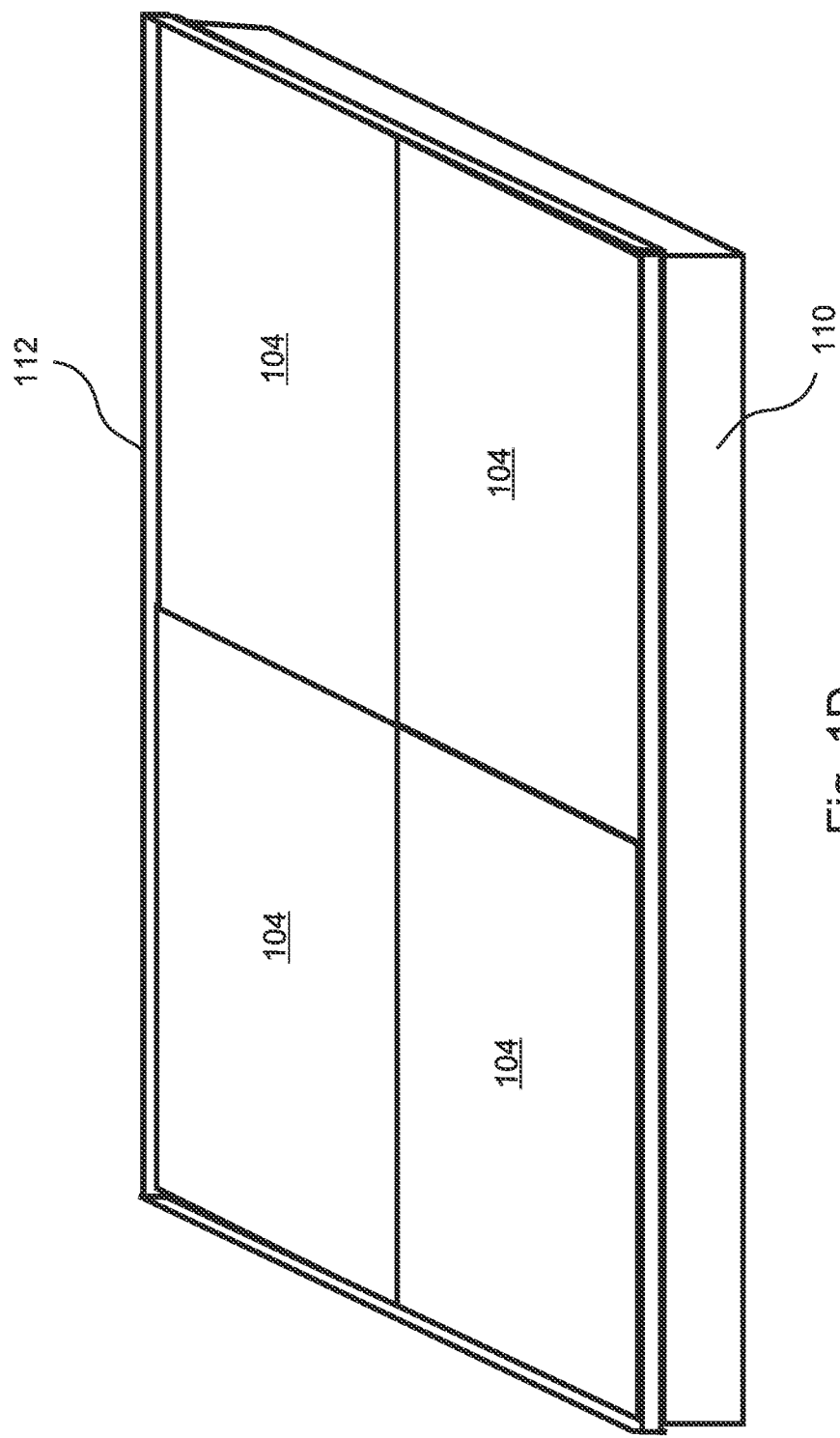
FIG. 1D shows a larger tiled substrate placed on a rectangular substrate tray that is configured to completely cover an underlying susceptor in an LP-HVPE crystal growth apparatus that does not require rotation of the substrate.

With reference to FIGS. 1C and 1D, this butting together of the cleaved tiles 104 takes place on a substrate holder 108, 110. FIG. 1C shows a round substrate holder 108 with a rectangular (square) recess at the center to keep the tiles in contact to create a tiled substrate 106. In embodiments, a round substrate holder is used if the tiled substrate 106 is to be rotated during growth to achieve a required uniformity of the growth rate and resulting material properties.

FIG. 1D shows a rectangular (square) substrate holder 110 having a lip 112 that is configured to keep the individual tiles 104 in intimate contact with each other to create the tiled substrate 106 during heating and epitaxial slab growth. This configuration is used in some embodiments where the epitaxial deposition apparatus offers sufficient thickness and property uniformity to eliminate any need for rotating the substrate during deposition. This approach can enable, the growth of larger wafers for a given reaction chamber size).

Figure 2A:
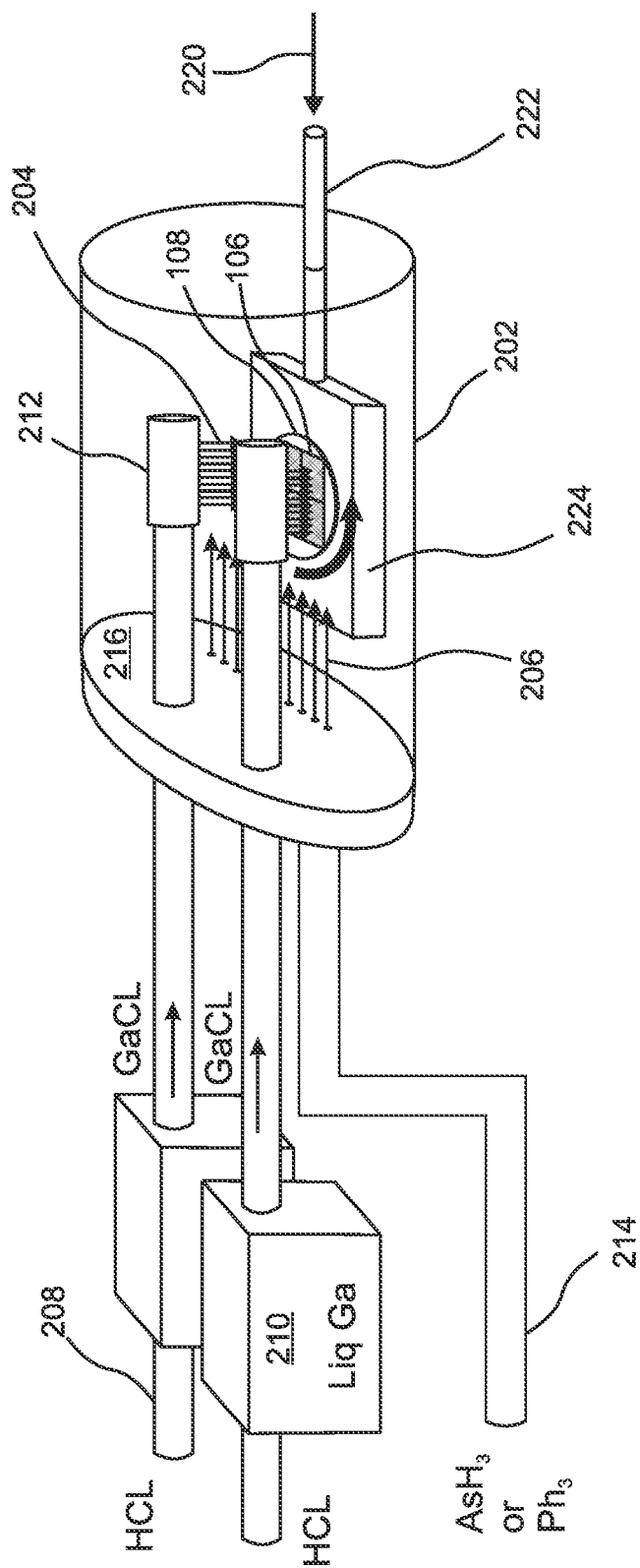
FIG. 2A is a perspective view showing the tray and substrate of FIG. 1C placed within an LP-HVPE reactor that is configured to rotate the substrate tray during epitaxial deposition.
Figure 2B:
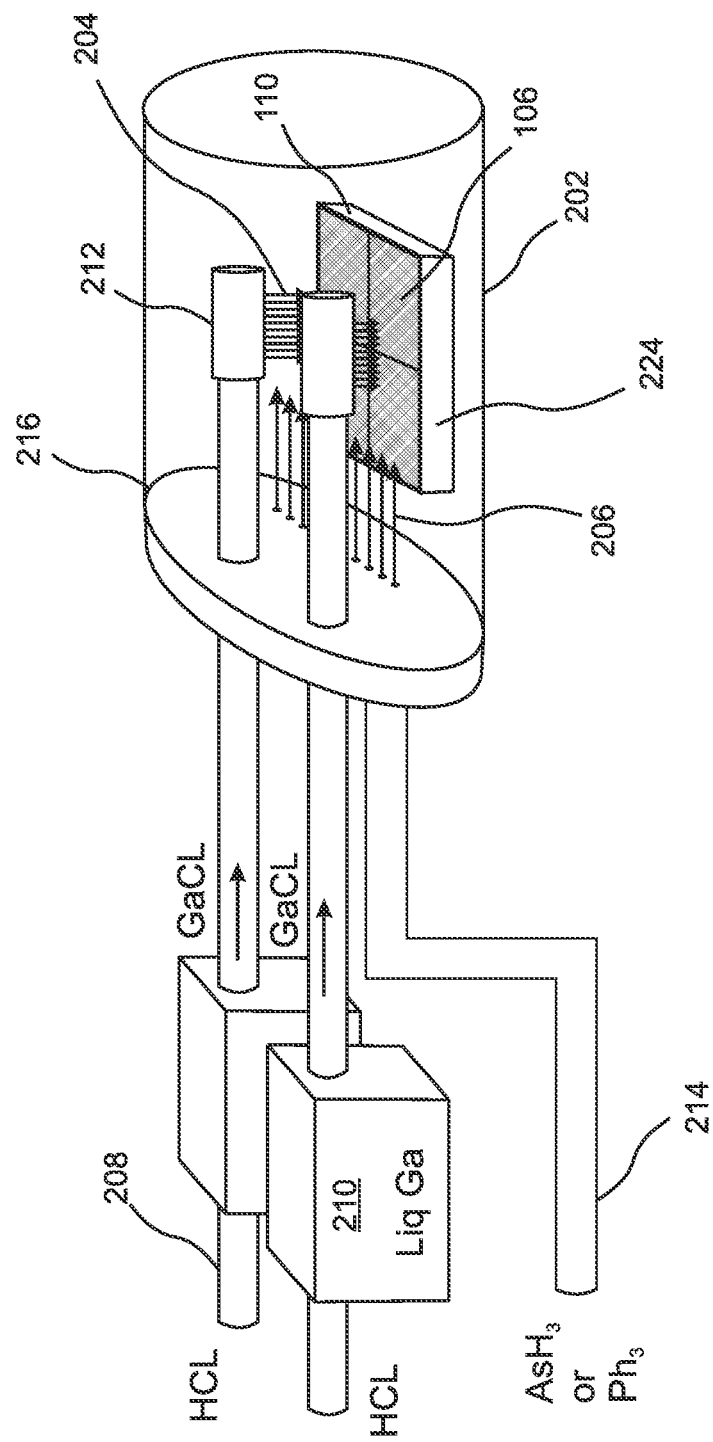
FIG. 2B is a perspective view showing the tray and substrate of FIG. 1D placed within an LP-HVPE reactor that does not require substrate rotation during epitaxial deposition.

FIGS. 2A and 2B illustrate the step of applying LP-HVPE to a tiled substrate 106 to grow a GaAs or GaP IR window slab. In embodiments, the tiled substrate 106 is placed within a reaction chamber 202 and subjected to two gases 204, 206 that react with each other at the surface of the substrate 106 to form GaAs or GaP, thereby growing a crystal on the substrate 106. In the illustrated example, HCl gas 208 flows over a reservoir of liquid gallium 210 to form GaCl gas 204 that is applied vertically to the substrate 106 by vertical nozzles 212. At the same time, AsH3 gas 214 is applied horizontally to the surface of the substrate 106 by a horizontal nozzle 216. In similar embodiments, PH3 gas 214 is applied in lieu of AsH3 so as to grow a crystal of GaP on the substrate 106.

In the illustrated example of FIG. 2A, the tiled substrate 106 is arranged on a round substrate holder 108 that is slowly rotated by a $H_2$ gas flow 220 which flows through a support tube 222 into a susceptor 224 and across grooves on the underside of the substrate holder 108 during the vacuum deposition process. In the illustrated example of FIG. 2B, the tiled substrate 106 is arranged on a larger rectangular substrate holder 110 that is stationary during the epitaxial growth. In this embodiment, rotation of the substrate holder 110 is not needed, because the vertical nozzles 212 are designed to provide uniform deposition.

In embodiments, as the HVPE growth progresses, any defects that might be nucleated at the boundaries 103 of the tiles 104 are healed, causing the tiles 104 to merge together with no physical boundaries between the individual tiles 104, and no degradation in optical quality.

The final result is the production of a single crystal GaAs or GaP IR window slab having uniform optical properties and having a largest dimension that is greater than four inches for GaP, or greater than eight inches for GaAs, and in embodiments greater than 12 inches. The disclosed method thereby enables scaling of the substrate up to a size that is limited only by the geometry of the HVPE reactor 202, and eliminates the "bowing" and other problems and complexities of HVPE growth on a foreign substrate. In embodiments, the substrate 106 remains as a permanent and indistinguishable component of the GaAs or GaP window slab, thereby obviating any requirement to grind the substrate 106 away in a subsequent production step.

In some embodiments, EMI shielded GaAs and GaP windows are produced by adding a dopant such as Si to the epitaxial gases 208 and/or 214 during the final stage of HVPE growth. In other embodiments, EMI shielded GaAs or GaP windows are produced by applying a layer of doped GaAs or GaP to the window slab in a subsequent deposition step, for example using an epitaxial method such as molecular beam epitaxy (MBE), metal-organic vapor phase epitaxy (MOVPE), metallo-organic chemical vapor deposition (MOCVD, or organo-metallic vapor phase epitaxy (OMVPE).

Embodiments further include applying an anti-reflective coating to the window slab, or to the doped conducting layer (if present).

Figure 3:
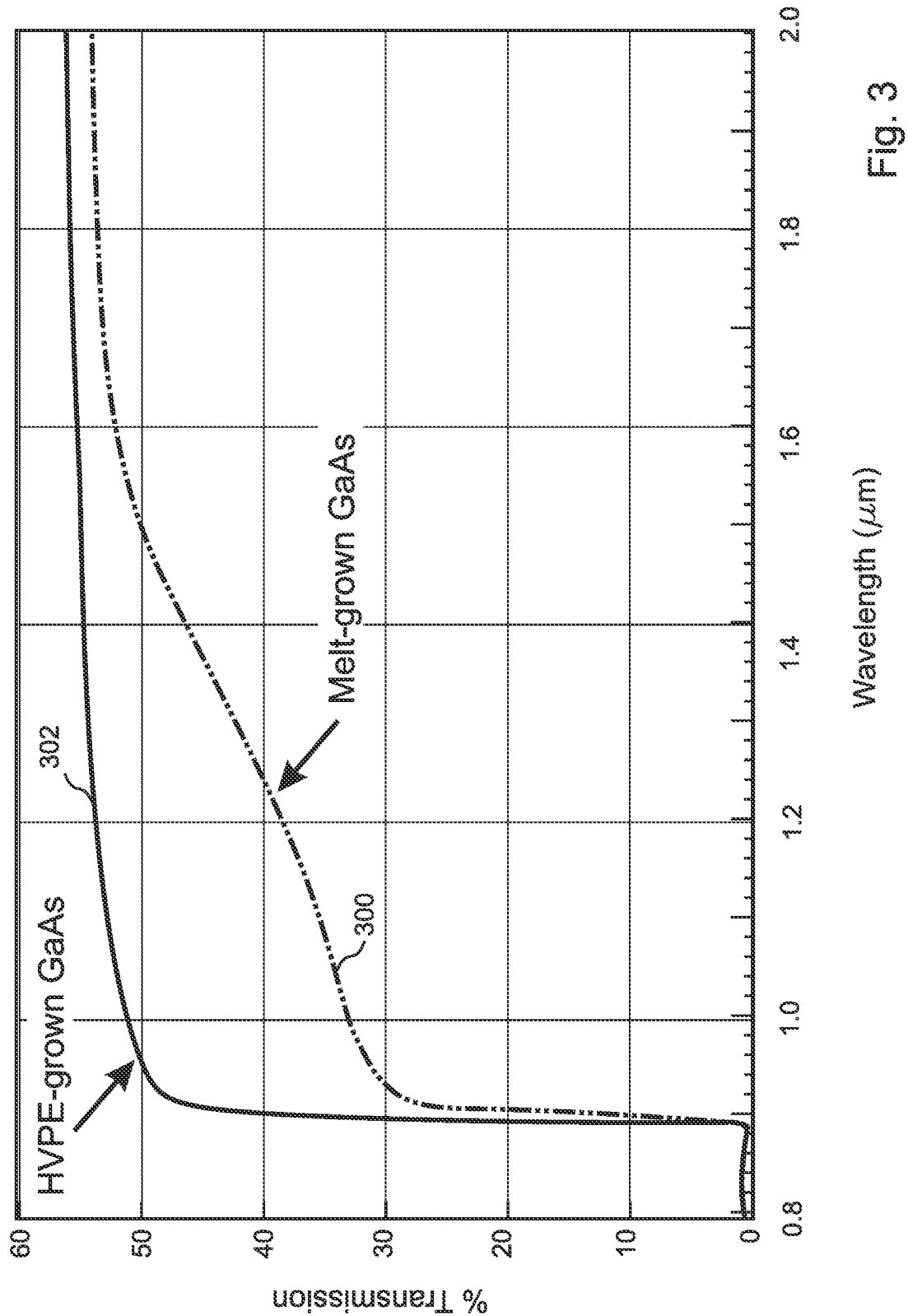
FIG. 3 is a graph that illustrates the decreased absorption near 1 micron of GaAs grown via LP-HVPE as compared to GaAs from a boule grown from melt.

With reference to FIG. 3, it is notable that HVPE-grown GaAs windows, and especially LP-HVPE-grown GaAs windows 302, typically exhibit significantly lower absorption than melt-grown "commercial off-the-shelf" (COTS) GaAs crystals 300, especially at wavelengths near 1 micron. In part, this is because GaAs grown using HVPE exhibits a greatly reduced concentration of impurities due to the use of ultra-high purity gas phase precursors. More importantly, native defects are reduced because the reduced growth temperatures of HVPE limit the solubility of excess arsenic that manifests itself as arsenic-on-gallium anti-sites. It is these so-called "EL2" defects that tend to cause high absorption losses in conventional, melt-grown GaAs windows at wavelengths near one micron. In the illustrated example, a GaAs wafer approximately 1 mm thick grown vertically from melt and sliced from a boule transmits less than 35% at one micron, whereas a GaAs layer of similar doping and thickness grown by LP-HVPE transmits more than 50% at the same wavelength.

Figure 4:
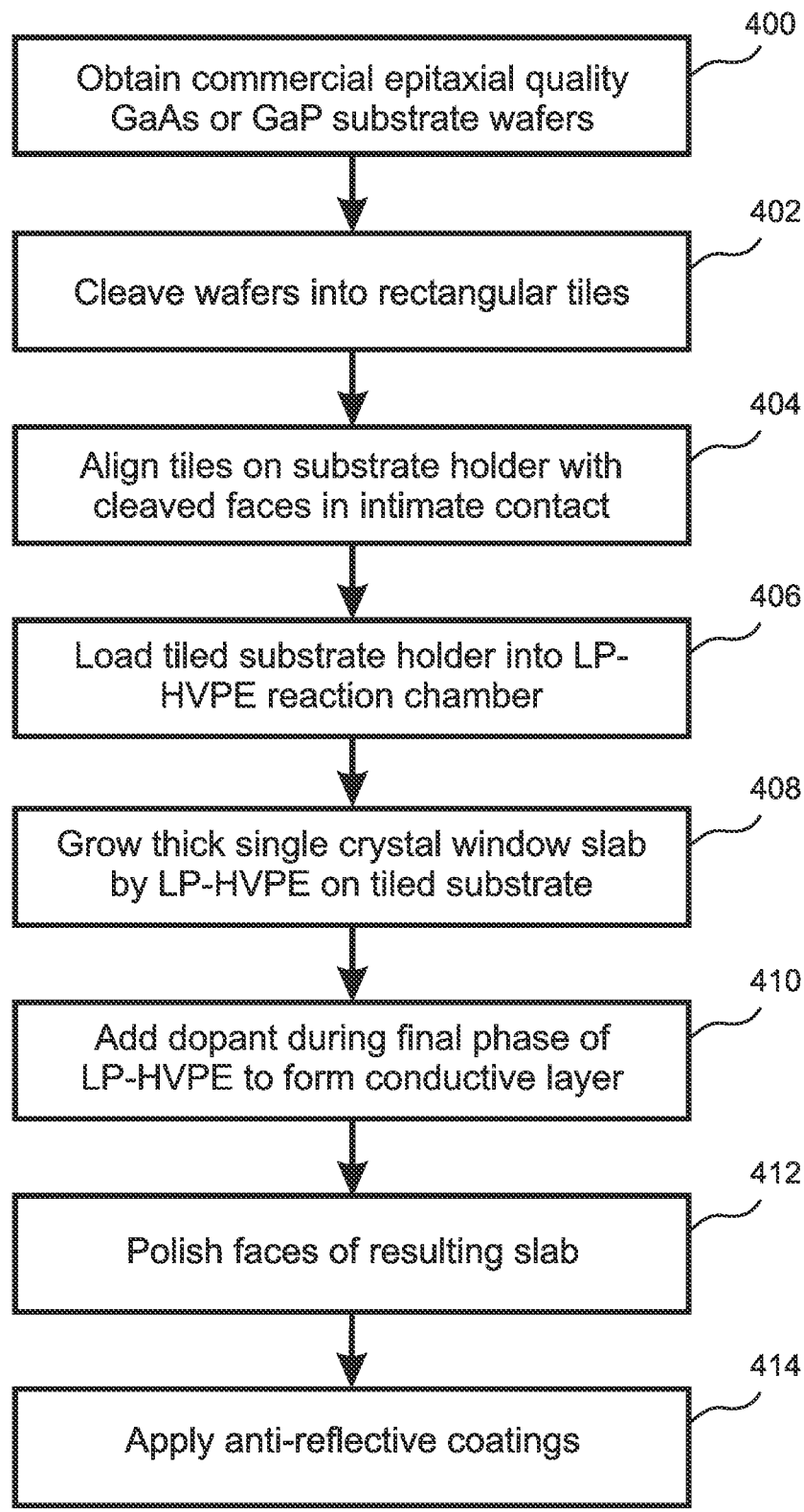
FIG. 4 is a flow diagram that illustrates a method embodiment of the present disclosure.

With reference to FIG. 4, embodiments of the disclosed method can be summarized as follows. A commercial epitaxial quality GaAs or GaP substrate is obtained 400, the substrate having a diameter of 8 inches or less for GaAs, and less than 4 inches for GaP. These substrates are then cleaved into rectangular tiles 402, and the tiles are aligned on a substrate holder with the cleaved facets in intimate surface contact 404. The substrate holder with the tiled substrate is then loaded into an LP-HVPE reactor 406.

LP-HVPE 408 is then used to grow a thick epitaxial layer on the tiled substrate. During this growth process, in embodiments, the boundaries between individual tiles are "healed," fusing them into a single, physically and optically uniform GaAs or GaP slab. The GaAs or GaP tiles are then brought into aligned contact and fused by optical bonding 406 to form a tiled single crystal, which is then used as a substrate for HVPE growth 408 of a GaAs or GaP slab. A dopant such as silicon can be added 410 to the HVPE gases during the final stage of growing the slab so as to provide a conductive layer of GaAs or GaP for EMI shielding.

Finally, the faces of the resulting slab are ground and polished 412. In some embodiments, the tiled substrate must be ground off to remove the original boundaries between substrate tiles, leaving only the HVPE layer. In other embodiments, the original boundaries between the individual substrate tiles "heal," disappearing by means of surface diffusion to yield a mechanically- and optically fused slab that can be polished as part of the window, eliminating any need to grind the substrate away from the slab after HVPE growth is complete. In various embodiments, an anti-reflective coating is applied 414 to one or both of the window faces as a final step.

The foregoing description of the embodiments of the invention has been presented for the purposes of illustration and description. Each and every page of this submission, and all contents thereon, however characterized, identified, or numbered, is considered a substantive part of this application for all purposes, irrespective of form or placement within the application. This specification is not intended to be exhaustive or to limit the invention to the precise form disclosed. Many modifications and variations are possible in light of this disclosure.

Although the present application is shown in a limited number of forms, the scope of the invention is not limited to just these forms, but is amenable to various changes and modifications. The disclosure presented herein does not explicitly disclose all possible combinations of features that fall within the scope of the invention. The features disclosed herein for the various embodiments can generally be interchanged and combined into any combinations that are not self-contradictory without departing from the scope of the invention. In particular, the limitations presented in dependent claims below can be combined with their corresponding independent claims in any number and in any order without departing from the scope of this disclosure, unless the dependent claims are logically incompatible with each other.

We claim:
1. A slab of GaAs having a largest dimension that is greater than eight inches or a slab of GaP having a largest dimension that is greater than four inches, the slab being suitable for forming an infrared (IR) transparent window, the slab being formed by the process:
obtaining a plurality of epitaxial quality GaAs or GaP wafers;
cleaving the wafers into tiles having cleaved edges;
aligning the cleaved edges of the tiles on a substrate holder in intimate contact, optical bonding thereof thereby yielding a tiled GaAs substrate having a largest dimension that is greater than eight inches or a GaP substrate having a largest dimension that is greater than four inches;
preparing an HVPE reactor having a reaction chamber that is sufficiently large to contain the tiled substrate and to apply gasses thereto;
placing the substrate holder and tiled substrate into the reaction chamber of the HVPE reactor;
applying a plurality of HVPE gases to a surface of the tiled substrate within the reaction chamber, such that at least two of the HVPE gases react with each other to form GaAs or GaP on the tiled substrate via HVPE, thereby causing a slab of GaAs to form on the tiled substrate having a largest dimension of greater than eight inches, or a slab of GaP having a largest dimension of greater than four inches; and growing the GaAs or GaP slab via the HVPE to a desired thickness by continuing to apply the gases to a surface of the slab.

2. The slab of GaAs or GaP of claim 1, wherein any defects that are nucleated at the boundaries of the tiles are healed as the slab is grown via HVPE, causing the tiles to merge together with no physical boundaries between them and substantially no degradation in optical quality of the slab, thereby obviating any need to grind away the tiled substrate after the growing by HVPE has been completed.

3. The slab of GaAs or GaP of claim 1, wherein cleaving the wafers includes cleaving the wafers along a (110) crystalline direction.

4. The slab of GaAs or GaP of claim 1, wherein the slab is a slab of GaAs having a largest dimension of greater than 12 inches, or a slab of GaP having a largest dimension of greater than 8 inches.

5. The slab of GaAs or GaP of claim 1, wherein a thickness of the slab is at least 2 mm.

6. The slab of GaAs or GaP of claim 1, further comprising an electrically conductive layer of doped GaAs or GaP on the slab.

7. The slab of GaAs or GaP of claim 1, further comprising an anti-reflective coating applied to at least one surface of the slab.

8. A method of producing a slab of GaAs or GaP, the slab being suitable for forming a GaAs infrared (IR) transparent window having a largest dimension that is greater than eight inches, or a GaP infrared (IR) transparent window having a largest dimension that is greater than four inches, the method comprising:
    obtaining a plurality of epitaxial quality GaAs or GaP wafers;
    cleaving the wafers into tiles having cleaved edges;
    aligning the cleaved edges of the tiles on a substrate holder in intimate contact, optical bonding thereof thereby yielding a GaAs tiled substrate having a largest dimension that is greater than eight inches, or a GaP tiled substrate having a largest dimension that is greater than four inches;
    preparing an HVPE reactor having a reaction chamber that is sufficiently large to contain the tiled substrate and to apply gasses thereto;
    placing the substrate holder and tiled substrate into the reaction chamber of the HVPE reactor;
    applying a plurality of HVPE gases to a surface of the tiled substrate within the reaction chamber, such that at least two of the HVPE gases react with each other to form GaAs or GaP on the tiled substrate via HVPE, thereby causing a slab of GaAs to form on the tiled substrate having a largest dimension of greater than eight inches, or a slab of GaP having a largest dimension of greater than four inches; and
    growing the GaAs or GaP slab via the HVPE to a desired thickness by continuing to apply the gases to a surface of the slab.

9. The method of claim 8, wherein the method further includes heating the tiled substrate while applying a preliminary gas thereto prior to causing the slab of GaAs or GaP to form on the tiled substrate, said preliminary gas being flowing arsine if the tiled substrate is a GaAs substrate, or flowing phosphine if the tiled substrate is a GaP substrate.

10. The method of claim 8, wherein obtaining the epitaxial quality GaAs or GaP wafers includes obtaining the wafers from a commercial source.

11. The method of claim 8, wherein any defects that are nucleated at the boundaries of the tiles are healed as the slab is grown via HVPE, causing the tiles to merge together with no physical boundaries between them and substantially no degradation in optical quality of the slab, thereby obviating any need to grind away the tiled wafer after the growing by HVPE has been completed.

12. The method of claim 8, wherein the HVPE is LP-HVPE.

13. The method of claim 8, wherein cleaving the slices includes cleaving the slices along a (110) crystalline direction of the GaAs or GaP wafers.

14. The method of claim 8, wherein the tiles are rectangular.

15. The method of claim 8, wherein the tiles are parallelograms.

16. The method of claim 8, wherein the slab is a slab of GaAs having a largest dimension of greater than 12 inches, or a slab of GaP having a largest dimension of greater than 8 inches.

17. The method of claim 8, wherein the desired thickness is at least 2 mm.

18. The method of claim 17, wherein a time required to grow the slab to the desired thickness is no greater than 1 week.

19. The method of claim 8, further comprising, during a final phase of growing the slab, including a dopant gas as one of the gases that are applied to the surface of the slab, thereby forming an electrically conductive layer of doped GaAs or GaP on the slab.

20. The method of claim 19, wherein the dopant gas contains silicon.

21. The method of claim 8, further comprising applying a layer of doped GaAs or GaP to a surface of the slab after the slab has been removed from the HVPE reactor.

22. The method of claim 8, wherein one of the HVPE gases is GaCl.

23. The method of claim 22, wherein the GaCl is formed by reacting HCl gas with liquid Ga.

24. The method of claim 8, wherein one of the HVPE gases is $AsH_3$.

25. The method of claim 8, wherein one of the HVPE gases is $PH_3$.

26. The method of claim 8, further comprising, after the slab has grown to the desired thickness, applying an anti-reflective coating to at least one surface of the slab.

* * * * *